US009857253B2

(12) United States Patent
Toyama

(10) Patent No.: US 9,857,253 B2
(45) Date of Patent: Jan. 2, 2018

(54) SENSOR ASSEMBLY AND METHOD OF MANUFACTURING THE SENSOR ASSEMBLY HAVING A MAGNETIC SENSOR CIRCUIT, A HOLDER HOLDING THE MAGNETIC SENSOR CIRCUIT AND INCLUDING FIRST AND SECOND HOLDER MEMBERS, AND A RESIN CASE CONTAINING THE HOLDER

(71) Applicant: JTEKT CORPORATION, Osaka-shi, Osaka (JP)

(72) Inventor: Yuichi Toyama, Owariasahi (JP)

(73) Assignee: JTEKT CORPORATION, Osaka (JP)

( * ) Notice: Subject to any disclaimer, the term of this patent is extended or adjusted under 35 U.S.C. 154(b) by 0 days.

(21) Appl. No.: 15/361,169

(22) Filed: Nov. 25, 2016

(65) Prior Publication Data

US 2017/0160151 A1 Jun. 8, 2017

(30) Foreign Application Priority Data

Dec. 3, 2015 (JP) .................................. 2015-236656
Jan. 14, 2016 (JP) .................................. 2016-005565

(51) Int. Cl.
*G01L 3/10* (2006.01)
*G01L 5/22* (2006.01)
(Continued)

(52) U.S. Cl.
CPC .............. *G01L 3/104* (2013.01); *G01L 3/101* (2013.01); *G01L 5/221* (2013.01); *G01R 33/0047* (2013.01); *G01R 33/072* (2013.01)

(58) Field of Classification Search
CPC ... G01L 3/104; G01L 3/10; G01L 5/22; G01L 3/101; G01L 5/221; G01R 33/0047
(Continued)

(56) References Cited

U.S. PATENT DOCUMENTS 8,393,230 B2 * 3/2013 Jeon .......................... B62D 6/10
   73/862.193
9,255,857 B2 * 2/2016 Hotta ................... B62D 5/0481
(Continued)

FOREIGN PATENT DOCUMENTS

| JP | 2007-170963 A | 7/2007 |
| JP | 2015-031600 A | 2/2015 |
| WO | 2014/199956 A1 | 12/2014 |

OTHER PUBLICATIONS

Mar. 24, 2017 Extended Search Report issued in European Patent Application No. 16201494.8.

*Primary Examiner* — Lisa Caputo
*Assistant Examiner* — Octavia Hollington
(74) *Attorney, Agent, or Firm* — Oliff PLC

(57) ABSTRACT

A sensor assembly for a torque sensor including a magnetic flux output device to output a magnetic flux in response to torsion produced between ends of a torsion bar. The sensor assembly includes a magnetic sensor circuit, a holder holding the magnetic sensor circuit and including first and second holder members, and a resin case containing the holder. The magnetic sensor circuit is provided to output a detection value indicating a torque applied to the torsion bar and calculated from the magnetic flux output from the magnetic flux output device. The magnetic sensor circuit has first and second circuit principal surfaces. The magnetic sensor circuit is partially disposed in a space defined by the first and second holder members and a first holder side wall of the first holder member inclined inward and in contact with the second holder member.

7 Claims, 8 Drawing Sheets

(51) Int. Cl.
*G01R 33/00* (2006.01)
*G01R 33/07* (2006.01)

(58) Field of Classification Search
USPC ......... 73/862.325, 82.331–862.338, 862.191
See application file for complete search history.

(56) References Cited

U.S. PATENT DOCUMENTS

| | | |
|---|---|---|
| 2003/0167857 A1 | 9/2003 | Sugimura et al. |
| 2010/0084215 A1* | 4/2010 | Sakatani ................ G01L 3/104 180/444 |
| 2015/0033877 A1 | 2/2015 | Hotta et al. |
| 2016/0273982 A1* | 9/2016 | Matsui .................... B62D 6/10 |

\* cited by examiner

L ←W→ R

SENSOR ASSEMBLY AND METHOD OF MANUFACTURING THE SENSOR ASSEMBLY HAVING A MAGNETIC SENSOR CIRCUIT, A HOLDER HOLDING THE MAGNETIC SENSOR CIRCUIT AND INCLUDING FIRST AND SECOND HOLDER MEMBERS, AND A RESIN CASE CONTAINING THE HOLDER

INCORPORATION BY REFERENCE

The disclosures of Japanese Patent Applications No. 2015-236656 filed on Dec. 3, 2015 and 2016-005565 filed on Jan. 14, 2016 including the specifications, drawings and abstracts are incorporated herein by reference in their entirety.

BACKGROUND OF THE INVENTION

1. Field of the Invention

The invention relates generally to sensor assemblies and sensor assembly manufacturing methods, and in particular to a sensor assembly to be included in a torque sensor and a method for manufacturing such a sensor assembly.

2. Description of the Related Art

Japanese Patent Application Publication No. 2015-31600 (JP 2015-31600 A), for example, discloses a magnetic sensor circuit known in the related art. This magnetic sensor circuit includes magnetic sensing elements that are components of a torque sensor and is surrounded with a resin by insert molding.

Insert molding to be performed using a resin involves heating the resin to a high temperature so as to cause the resin to have fluidity, and placing the resin under high pressure so as to inject the resin into a mold. When the high-temperature and high-pressure resin comes into contact with a magnetic sensor circuit during insert molding, the magnetic sensor circuit may degrade in reliability.

SUMMARY OF THE INVENTION

An object of the invention is to provide a sensor assembly and a sensor assembly manufacturing method that reduce or prevent degradation in reliability of a magnetic sensor circuit.

One aspect of the invention provides a sensor assembly to be included in a torque sensor including a magnetic flux output device to output a magnetic flux in response to torsion produced between ends of a torsion bar. The sensor assembly includes a magnetic sensor circuit, a holder, and a case. The magnetic sensor circuit is configured to output a detection value indicating a torque applied to the torsion bar. The detection value is calculated from the magnetic flux output from the magnetic flux output device. The magnetic sensor circuit includes a pair of first and second circuit principal surfaces. The holder holds the magnetic sensor circuit. The case contains the holder. The holder includes a first holder member and a second holder member. The first holder member includes a first holder principal surface facing the first circuit principal surface of the magnetic sensor circuit. The second holder member includes a second holder principal surface facing the second circuit principal surface of the magnetic sensor circuit. The first holder member further includes a first holder side wall protruding from the first holder principal surface toward the second holder member. The magnetic sensor circuit is partially disposed in a space defined by the first holder member, the second holder member, and the first holder side wall and is thus held by the holder. The first holder side wall is inclined inward and in contact with the second holder member. The case is made of a resin. The case is in contact with a first holder side wall outer surface of the first holder side wall.

In this aspect, the first holder side wall is inclined and in contact with the second holder member, and the case is in contact with the first holder side wall outer surface. This prevents, during molding of the case, the resin constituting the case from intruding into the inner space of the holder. Consequently, this aspect reduces or prevents degradation in reliability of the magnetic sensor circuit.

BRIEF DESCRIPTION OF THE DRAWINGS

The foregoing and further features and advantages of the invention will become apparent from the following description of example embodiments with reference to the accompanying drawings, wherein like numerals are used to represent like elements and wherein.

DETAILED DESCRIPTION OF EMBODIMENTS

A sensor assembly and a sensor assembly manufacturing method according to a first embodiment of the invention will be described below with reference to the accompanying drawings.

Figure 1:
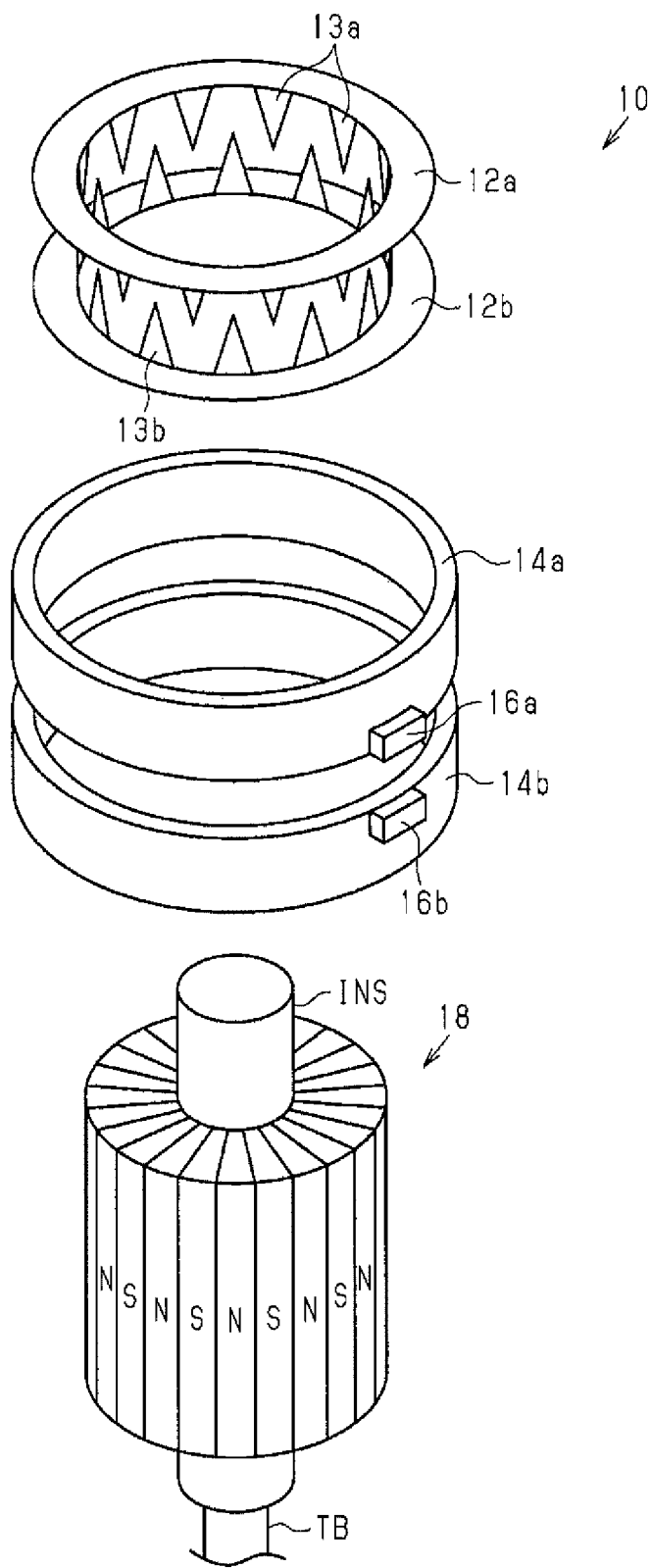
FIG. 1 is a perspective view of a magnetic flux output device according to a first embodiment of the invention.

FIG. 1 illustrates a magnetic flux output device 10 included in a torque sensor. The magnetic flux output device 10 generates a magnetic flux in response to torsion of a torsion bar TB and outputs the magnetic flux generated. The torsion bar TB is coupled to an input shaft. INS that rotates together with a steering wheel. The magnetic flux output device 10 includes: magnetic yokes 12a, 12b; magnetic flux collector rings 14a, 14b; and a cylindrical permanent magnet 18 coupled to the input shaft INS. The permanent magnet 18 includes north and south poles disposed alternately at regular intervals in the circumferential direction of the permanent magnet 18. The magnetic yoke 12a is provided with teeth 13a disposed at regular intervals in the circumferential direction of the magnetic yoke 12a. The magnetic yoke 12b is provided with teeth 13b disposed at regular intervals in the circumferential direction of the magnetic yoke 12b. The number of teeth 13a and the number of teeth 13b are each equal to the number of north poles of the permanent magnet 18 (or the number of south poles of the permanent magnet 18). The magnetic flux collector rings 14a, 14b are cylindrical members. The magnetic flux collector ring 14a is provided with a magnetic flux collector 16a. The magnetic flux collector ring 14b is provided with a magnetic flux collector 16b.

The magnetic flux output device 10 is configured so that the magnetic yokes 12a, 12b face the permanent magnet 18, the magnetic flux collector ring 14a faces the magnetic yoke 12a, the magnetic flux collector ring 14b faces the magnetic yoke 12b, and the magnetic yokes 12a, 12b and the magnetic flux collector rings 14a, 14b are disposed coaxially with the input shaft INS. Specifically, the magnetic yokes 12a, 12b and the magnetic flux collector rings 14a, 14b are fixed to an output shaft through the torsion bar TB. The output shaft is fixed to an end of the torsion bar TB opposite to the input shaft INS. The circumferential positions of the teeth 13a of the magnetic yoke 12a are deviated from the circumferential positions of the teeth 13b of the magnetic yoke 12b.

The above-described configuration causes a magnetic flux produced by the magnetic yoke 12a to be collected by the magnetic flux collector 16a through the magnetic flux collector ring 14a, and causes a magnetic flux produced by the magnetic yoke 12b to be collected by the magnetic flux collector 16b through the magnetic flux collector ring 14b. The magnetic flux density between the magnetic flux collector 16a and the magnetic flux collector 16b changes depending on the position of the permanent magnet 18 relative to the magnetic yokes 12a, 12b. The permanent magnet 18 is fixed to the input shaft INS, and the magnetic yokes 12a, 12b are fixed to the output shaft. This means that the position of the permanent magnet 18 relative to the magnetic yokes 12a, 12b changes in accordance with the degree of torsion of the torsion bar TB. In other words, the position of the permanent magnet 18 relative to the magnetic yokes 12a, 12b changes in accordance with a torque input to the input shaft INS. Thus, the magnetic flux density between the magnetic flux collector 16a and the magnetic flux collector 16b changes in accordance with the torque input to the input shaft INS. The magnetic flux output device 10 outputs, from between the magnetic flux collector 16a and the magnetic flux collector 16b, a magnetic flux responsive to the torque input to the input shaft INS.

Figure 2:
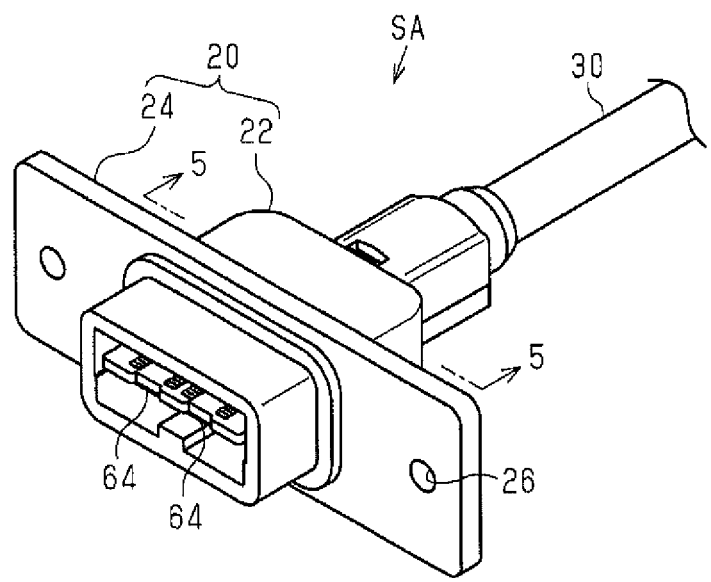
FIG. 2 is a perspective view of a sensor assembly according to the first embodiment.

FIG. 2 illustrates a sensor assembly SA to detect a magnetic flux output from the magnetic flux output device 10. The sensor assembly SA includes a case 20. The case 20 contains integrated circuits 64 each including a Hall element. The sensor assembly SA is connected to a harness 30. The harness 30 is configured to transmit output signals from the integrated circuits 64 to a controller. The controller is configured to operate a steering actuator to steer steered wheel(s). The case 20 includes: a body 22 containing the integrated circuits 64; and a flange 24 that serves to fix the sensor assembly SA to a housing for the magnetic flux output device 10. The flange 24 is provided with holes 26. Bolts are inserted into the holes 26, thus fastening the sensor assembly SA to the housing for the magnetic flux output device 10.

Figure 3:
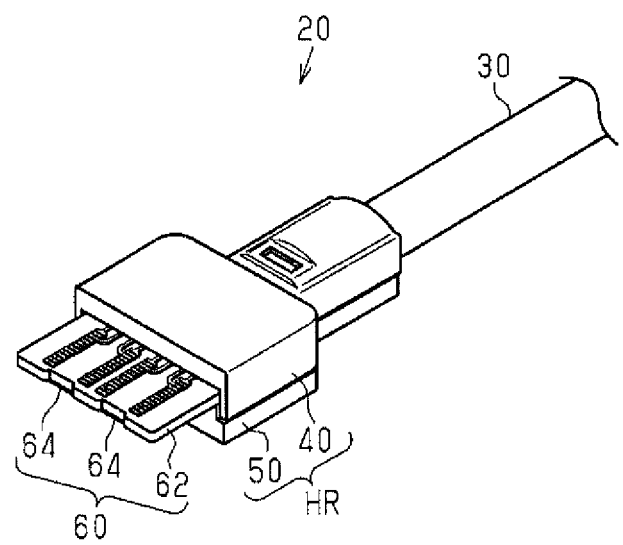
FIG. 3 is a perspective view of a holder and a magnetic sensor circuit according to the first embodiment.

FIG. 3 illustrates a holder HR to be contained in the body 22 of the case 20. The holder HR contains a portion of a magnetic sensor circuit 60 so as to hold the magnetic sensor circuit 60. The magnetic sensor circuit 60 includes the integrated circuits 64, and a substrate 62 having the integrated circuits 64 mounted thereon. Specifically, as illustrated in FIG. 3, the holder HR is made up of a combination of a first holder member 40 and a second holder member 50. The case 20 is formed by injection molding. The injection molding of the case 20 involves placing the holder HR in a mold, and injecting a molten resin into the mold. In other words, the case 20 is formed by insert molding.

Figure 4:
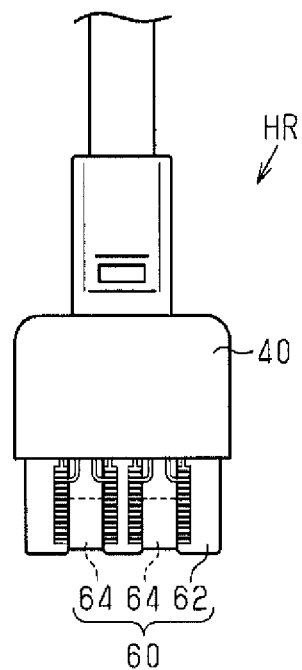
FIG. 4 is a plan view of the holder according to the first embodiment.
Figure 5:
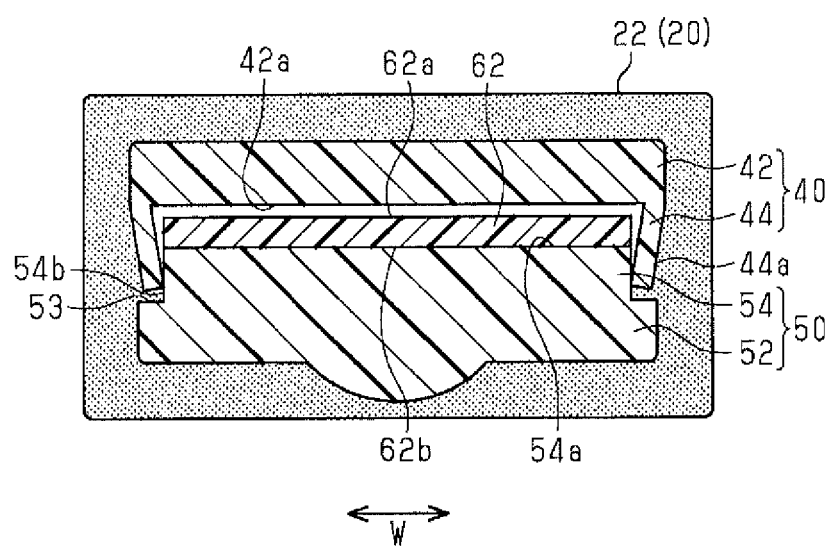
FIG. 5 is a cross-sectional view taken along the line 5-5 in FIG. 2.

FIG. 4 is a plan view of the holder HR. FIG. 5 is a cross-sectional view of the sensor assembly SA. The cross section illustrated in FIG. 5 is taken along the line 5-5 in FIG. 2. Specifically, the cross section illustrated in FIG. 5 is perpendicular to the direction of protrusion of the substrate 62 from the holder HR. A direction parallel to the substrate 62 and perpendicular to the direction of protrusion of the substrate 62 from the holder HR, in particular, will hereinafter be referred to as a "width direction W of the substrate 62".

The first holder member 40 includes a first holder base 42, and first holder side walls 44 each protruding from the first holder base 42. The first holder base 42 includes a first holder principal surface 42a. The substrate 62 includes a principal surface 62a. The first holder principal surface 42a faces the principal surface 62a of the substrate 62. Each first holder side wall 44 is a thin plate member protruding from the first holder principal surface 42a toward the second holder member 50. As used herein, the term "principal surface" refers to a flat and relatively large surface of a component. The first holder side walls 44 are provided on both sides of the first holder base 42 in the width direction W of the substrate 62. In other words, the first holder member 40 includes a pair of side walls extending from opposite sides of the first holder principal surface 42a. The first holder member 40 is made of a resin and formed by injection molding. The first holder member 40 and the case 20 are made of the same material.

The second holder member 50 includes a large base 52, steps 53, and a small base 54. The small base 54 includes a surface parallel to the substrate 62. The steps 53 make the surface of the small base 54 smaller in area than the large base 52. The surface of the small base 54 is provided as a second holder principal surface 54a facing a principal surface 62b of the substrate 62. The steps 53 are provided on both sides of the large base 52 in the width direction W of the substrate 62 and disposed to face the first holder side walls 44. The second holder member 50 is made of a resin and formed by injection molding. The second holder member 50 and the case 20 are made of the same material.

The first holder side walls 44 are inclined inward in the width direction W of the substrate 62 and in contact with end faces 54b of the small base 54 of the second holder member 50. The first holder side walls 44 include first holder side wall outer surfaces 44a that are outer surfaces of the first holder side walls 44 in the width direction W. The case 20 is in contact with the first holder side wall outer surfaces 44a. This structure will be referred to as a "first structure".

Figure 6A:
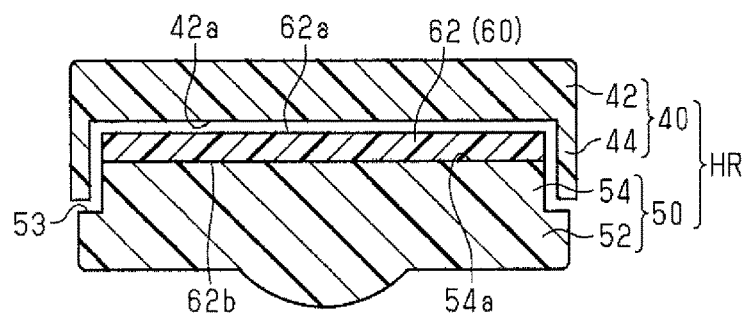
FIG. 6A is a cross-sectional view illustrating a sensor assembly manufacturing step according to the first embodiment.

The following description discusses how this embodiment works. FIG. 6A illustrates a placing step included in the process of manufacturing the sensor assembly SA. The placing step involves placing a portion of the substrate 62 of the magnetic sensor circuit 60 in the holder FIR. The first holder side walls 44 extend perpendicularly with respect to the first holder principal surface 42a.

Figure 6B:
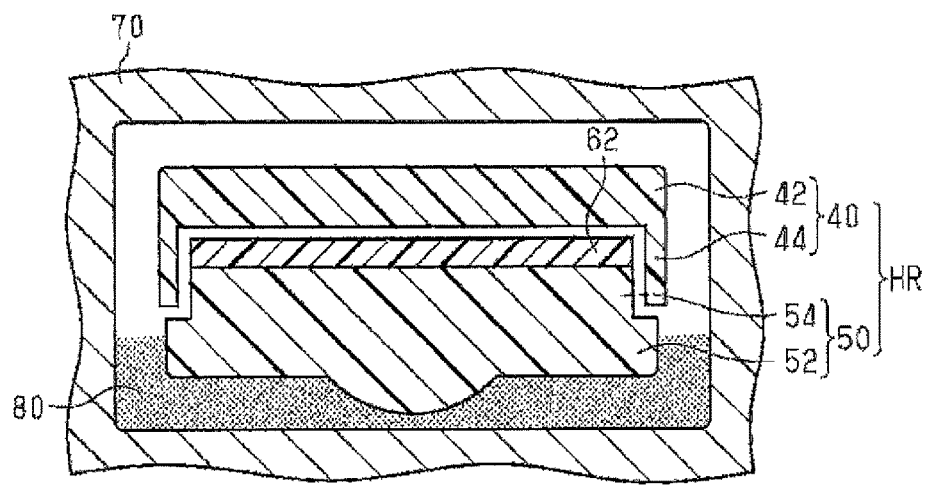
FIG. 6B is a cross-sectional view illustrating a sensor assembly manufacturing step according to the first embodiment.

FIG. 6B illustrates the first half of an insert molding step included in the process of manufacturing the sensor assembly SA. The first half of the insert molding step involves: placing the holder HR in a mold 70 for the case 20; and injecting a resin material 80 into the mold 70. The resin material 80 to be injected into the mold 70 is heated to a high temperature (e.g., 230° C.) and thus fluidized, and is held under high pressure.

Figure 6C:
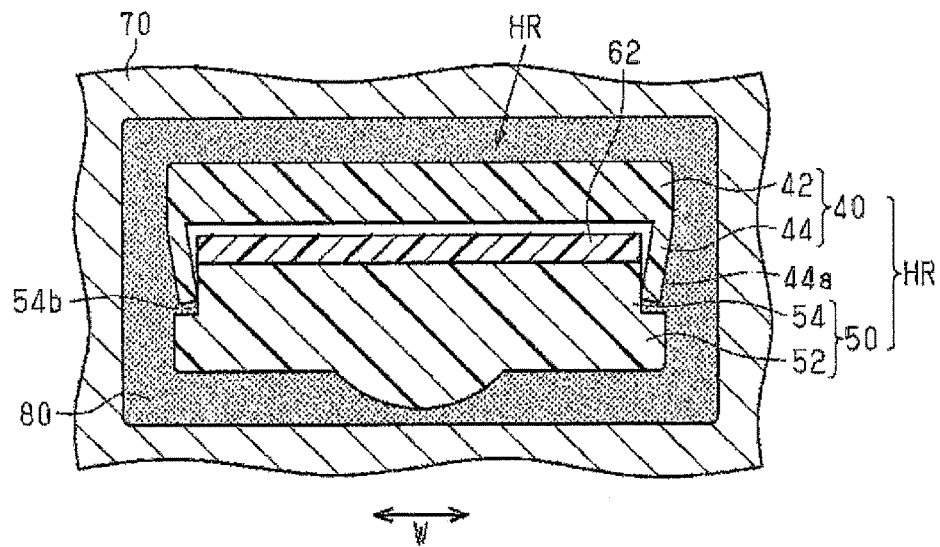
FIG. 6C is a cross-sectional view illustrating a sensor assembly manufacturing step according to the first embodiment.

FIG. 6C illustrates the second half of the insert molding step. As illustrated in FIG. 6C, the contact of the resin material 80 under high pressure with the first holder side walls 44 applies forces to the first holder side wall outer surfaces 44a so as to press the first holder side walls 44 inward in the width direction W of the substrate 62. The forces applied cause the first holder side walls 44 to incline inward and come into contact with the end faces 54b of the small base 54 of the second holder member 50. This means that although the application of pressure from the resin material 80 to the first holder side wall outer surfaces 44a causes displacement of the first holder side walls 44, the displacement of the first holder side walls 44 is restricted by the contact of the first holder side walls 44 with the end faces 54b of the small base 54.

In the course of the second half of the insert molding step, the pressure applied from the resin material 80 to the first holder side wall outer surfaces 44a causes the first holder side walls 44 to press the small base 54, resulting in a reaction that causes the small base 54 to press back the first holder side walls 44. Thus, large pressure is applied to the positions of contact between the first holder side walls 44 and the small base 54. This prevents intrusion of the resin material 80 into the inner space of the holder HR from outside the holder HR.

The first embodiment thus described achieves the effects described below.

(1) The magnetic sensor circuit 60 is provided by soldering electronic components, such as the integrated circuits 64, to the substrate 62. Solder has a melting point of 220° C., for example. This means that the melting point of solder is lower than the melting point of the resin material 80. Thus, intrusion of the resin material 80 into the inner space of the holder HR may cause the temperature of the solder on the substrate 62 to exceed the melting point of the solder, causing the solder to come off. Because the resin material 80 is held under high pressure, intrusion of the resin material 80 into the inner space of the holder HR may apply pressure to the solder, causing the solder to come off. Furthermore, transmission of heat of the resin material 80 to the integrated circuits 64 may degrade the reliability of the integrated circuits 64. According to the the first embodiment, the application of pressure from the resin material 80 to the first holder side walls 44 causes the first holder side walls 44 to incline inward and come into contact with the second holder member 50. This prevents intrusion of the resin material 80 into the inner space of the holder HR, and eventually reduces or prevents degradation in reliability of the magnetic sensor circuit 60.

A second embodiment of the invention will be described below with reference to the drawings, with attention focused on differences between the second embodiment and the first embodiment.

FIGS. 7A to 7D are cross-sectional views of the sensor assembly SA according to this embodiment. The cross-sectional views of FIGS. 7A to 7D are associated with the cross-sectional view of FIG. 5. As illustrated in FIGS. 7A to 7D, the second holder member 50 according to this embodiment includes second holder side walls 56. Each second holder side wall 56 is a thin plate member extending from the second holder principal surface 54a of the small base 54 toward the first holder member 40. Specifically, the second holder side walls 56 are provided on both sides of the small base 54 in the width direction W of the substrate 62. In other words, the second holder side walls 56 are a pair of side walls extending from opposite sides of the second holder principal surface 54a. The first holder member 40 is provided with recesses 46 each facing an associated one of the pair of second holder side walls 56.

Figure 7A:
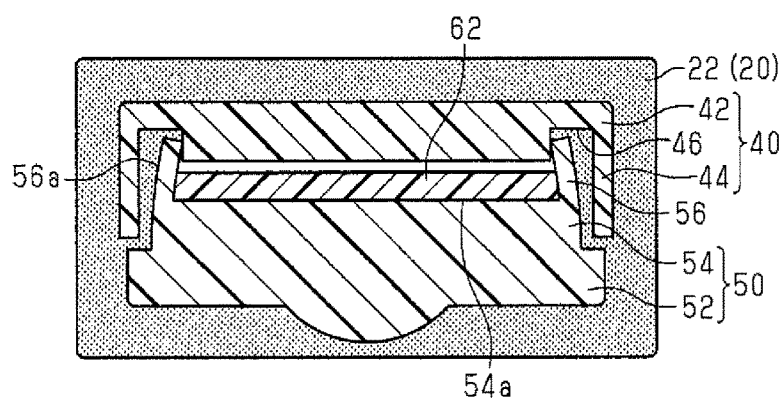
FIG. 7A is a cross-sectional view of a holder assembly according to a second embodiment of the invention.
Figure 7B:
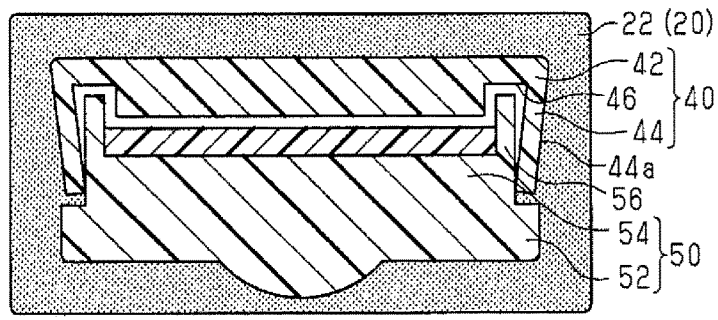
FIG. 7B is a cross-sectional view of the holder assembly according to the second embodiment.

FIG. 7A illustrates the sensor assembly SA having the following structure. The pair of second holder side walls 56 are each inclined inward in the width direction W of the substrate 62 and each in contact with the recess 46 adjacent to an associated one of the pair of first holder side walls 44, and the case 20 is in contact with second holder side wall outer surfaces 56a that are outer surfaces of the second holder side walls 56. This structure will be referred to as a "second structure". FIG. 7B illustrates the sensor assembly SA having the following structure. The pair of first holder side walls 44 are each inclined inward in the width direction W of the substrate 62 and each in contact with an associated one of the second holder side walls 56, and the case 20 is in contact with the first holder side wall outer surfaces 44a.

Figure 7C:
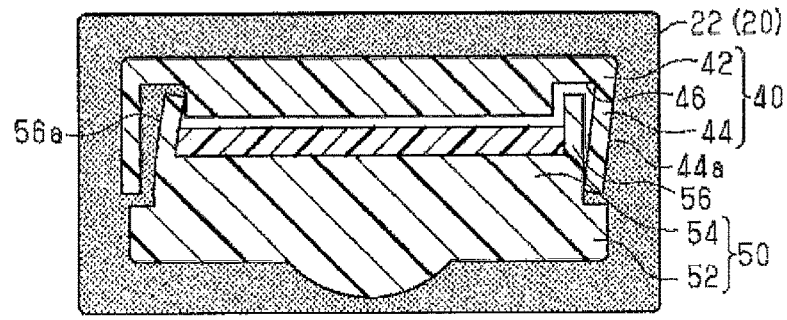
FIG. 7C is a cross-sectional view of the holder assembly according to the second embodiment.
Figure 7D:
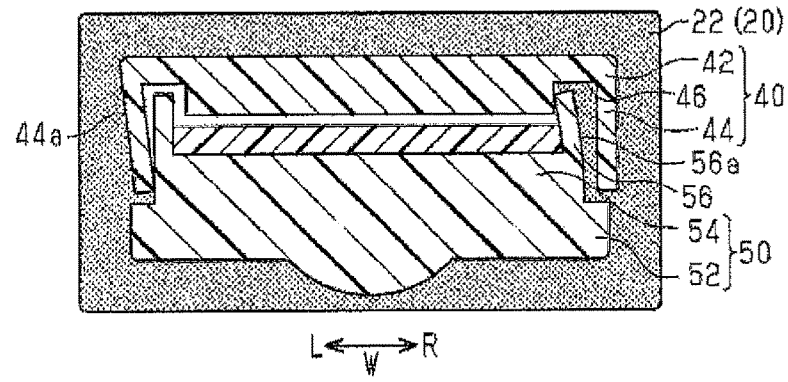
FIG. 7D is a cross-sectional view of the holder assembly according to the second embodiment.

Referring to FIGS. 7C and 7D, a portion of the sensor assembly SA located leftward of the widthwise center of the substrate 62 is defined as a "left side L", and a portion of the sensor assembly SA located rightward of the widthwise center of the substrate 62 is defined as a "right side R". FIG. 7C illustrates the sensor assembly SA having the following exemplary structure. The second holder side wall 56 on the left side L is inclined inward in the width direction W of the substrate 62 and in contact with the associated recess 46 of the first holder member 40, and the case 20 is in contact with the second holder side wall outer surface 56a on the left side L. The first holder side wall 44 on the right side R is inclined inward in the width direction W of the substrate 62 and in contact with the associated second holder side wall 56, and the case 20 is in contact with the first holder side wall outer surface 44a on the right side R. FIG. 7D illustrates the sensor assembly SA having the following exemplary structure. The first holder side wall 44 on the left side L is inclined inward in the width direction W of the substrate 62 and in contact with the associated second holder side wall 56, and the case 20 is in contact with the first holder side wall outer surface 44a on the left side L. The second holder side wall 56 on the right side R is inclined inward in the width direction W of the substrate 62 and in contact with the associated recess 46 of the first holder member 40, and the case 20 is in contact with the second holder side wall outer surface 56a on the right side R.

Figure 8A:
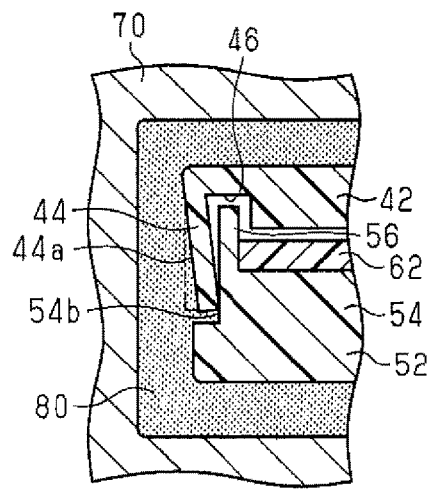
FIG. 8A is a cross-sectional view illustrating a sensor assembly manufacturing step according to the second embodiment.

The following description discusses how the second embodiment works. FIG. 8A illustrates an insert molding step included in the process of manufacturing the sensor assembly SA illustrated in FIG. 7B or 7D. As illustrated in FIG. 8A, injecting the resin material 80 into the mold 70 prompts the resin material 80 to exert a force on the first holder side wall outer surface(s) 44a so as to press the first holder side wall(s) 44 inward in the width direction W of the substrate 62. This causes the first holder side wall(s) 44 to incline inward and come into contact with the end face(s) 54b of the small base 54 of the second holder member 50. Consequently, this embodiment prevents intrusion of the resin material 80 into the inner space of the holder HR.

Figure 8B:
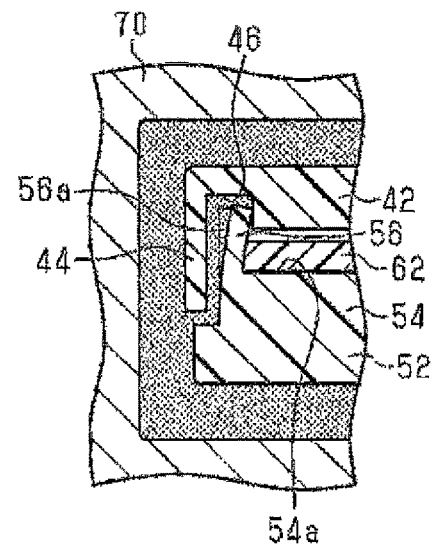
FIG. 8B is a cross-sectional view illustrating a sensor assembly manufacturing step according to the second embodiment.

FIG. 8B illustrates an insert molding step included in the process of manufacturing the sensor assembly SA illustrated in FIG. 7A or 7C. As illustrated in FIG. 8B, injecting the resin material 80 into the mold 70 prompts the resin material 80 to exert a force on the second holder side wall outer surface(s) 56a so as to press the second holder side wall(s) 56 inward in the width direction W of the substrate 62. This causes the second holder side wall(s) 56 to incline inward and come into contact with the recess(es) 46 of the first holder member 40. Consequently, this embodiment prevents intrusion of the resin material 80 into the inner space of the holder HR. As indicated by the dashed line in FIG. 8B, the second holder side wall(s) 56 extend(s) perpendicularly relative to the second holder principal surface 54a before the resin material 80 comes into contact with the second holder side wall(s) 56.

Which of the structures illustrated in FIGS. 7A to 7D will be provided for the sensor assembly SA depends on, for example, individual differences between the first holder member 40 and the second holder member 50. The second embodiment thus described achieves, in addition to the effects of the first embodiment, the effects described below.

(2) The first holder side wall(s) 44 and the second holder side wall(s) 56 provide a labyrinth structure. The probability of occurrence of either of the phenomenon illustrated in FIG. 8A and the phenomenon illustrated in FIG. 8B is higher than the probability of occurrence of the phenomenon illustrated in FIG. 8A. Consequently, the second embodiment prevents intrusion of the resin material 80 into the inner space of the holder HR more reliably than when no second holder side wall 56 is provided.

A third embodiment of the invention will be described below with reference to the drawings, with attention focused on differences between the third embodiment and the first embodiment.

Figure 9:
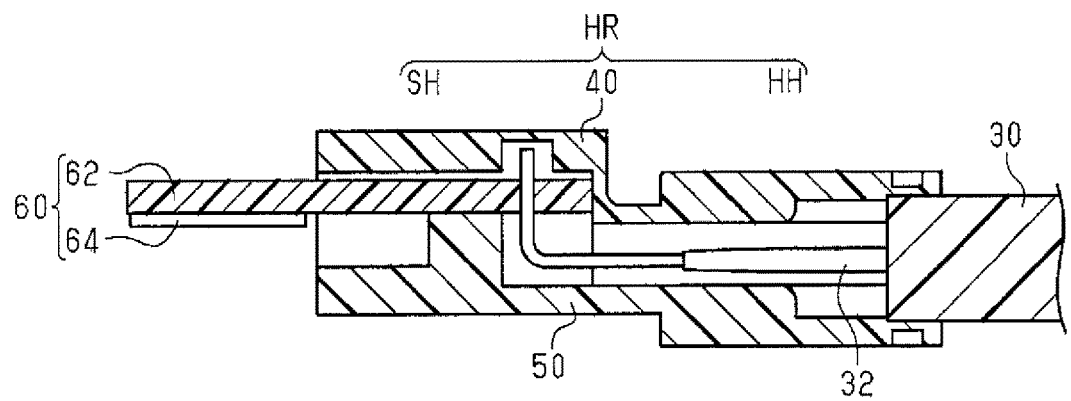
FIG. 9 is a cross-sectional view of a holder according to a third embodiment of the invention.

FIG. 9 is a cross-sectional view of the holder HR according to the third embodiment. In FIG. 9, components equivalent to those illustrated in FIG. 3 and the other figures are identified by the same reference signs for the sake of convenience. As illustrated in FIG. 9, the holder HR according to this embodiment includes: a sensor container SH containing a portion of the magnetic sensor circuit 60; and a harness container HH containing a portion of the harness 30. The sensor container SH and the harness container HH are molded in one piece. Specifically, the first holder member 40 and the second holder member 50 are components of the sensor container SH and the harness container HH. A portion of the first holder member 40 defining an upper portion of the harness container HH extends in the direction away from a portion of the first holder member 40 defining an upper portion of the sensor container SH, i.e., in the direction opposite to the direction of protrusion of the substrate 62 from the holder HR. A portion of the second holder member 50 defining a lower portion of the harness container HH extends in the direction away from a portion of the second holder member 50 defining a lower portion of the sensor container SH, i.e., in the direction opposite to the direction of protrusion of the substrate 62 from the holder HR.

Figure 10:
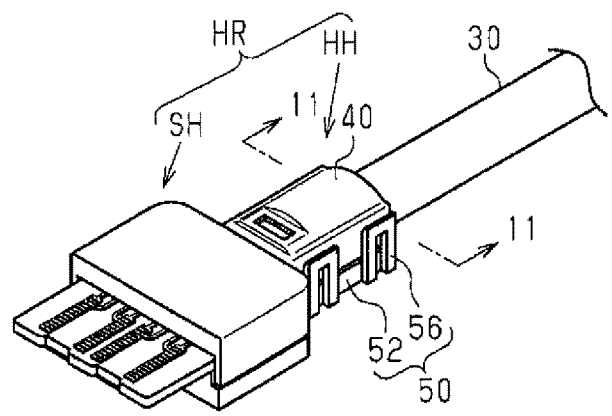
FIG. 10 is a perspective view of the holder according to the third embodiment.

As illustrated in FIG. 10, in this embodiment, the portion of the second holder member 50 defining the lower portion of the harness container HH is provided with two pairs of the second holder side walls 56 extending partially along the lateral surfaces of the harness container HH in the direction parallel to the direction of protrusion of the substrate 62 from the holder HR.

Figure 11:
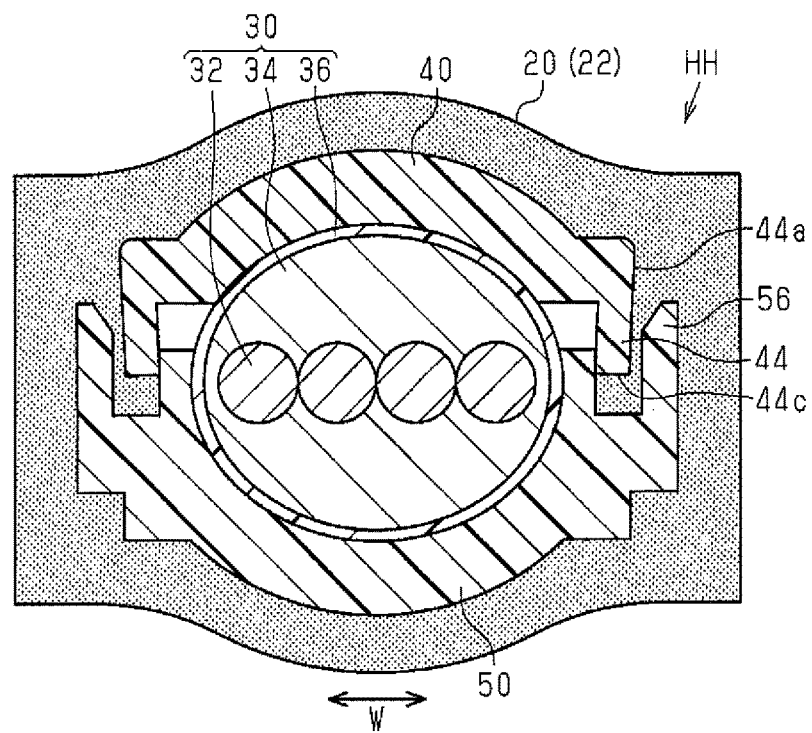
FIG. 11 is a cross-sectional view of a sensor assembly according to the third embodiment.

FIG. 11 is a cross-sectional view of a portion of the sensor assembly SA corresponding to the harness container HH. Specifically, although the cross section illustrated in FIG. 11 is taken along the line 11-11 in FIG. 10, the cross section illustrated in FIG. 11 is not a cross section of the holder HR but is a cross section of the sensor assembly SA.

As illustrated in FIG. 11, the harness 30 is sandwiched between the first holder member 40 and the second holder member 50 facing each other. The second holder side walls 56 according to this embodiment are disposed outward of the first holder side walls 44 in the width direction W. The pair of first holder side walls 44 are inclined inward and in contact with the second holder member 50, and the case 20 is in contact with the first holder side wall outer surfaces 44a of the pair of first holder side walls 44.

The harness 30 includes a plurality of wires 32, a cover 36, and a yarn 34. The cover 36 contains the plurality of wires 32 and defines the outer periphery of the harness 30. The inner space of the cover 36 is filled with the wires 32 and the yarn 34. Although the harness 30 originally has a circular cross-sectional shape, the cross section of the harness 30 illustrated in FIG. 11 is reduced in diameter in the direction in which the first holder member 40 and the second holder member 50 face each other, and thus has a substantially elliptical shape with its major axis corresponding to the width direction W.

Figure 12:
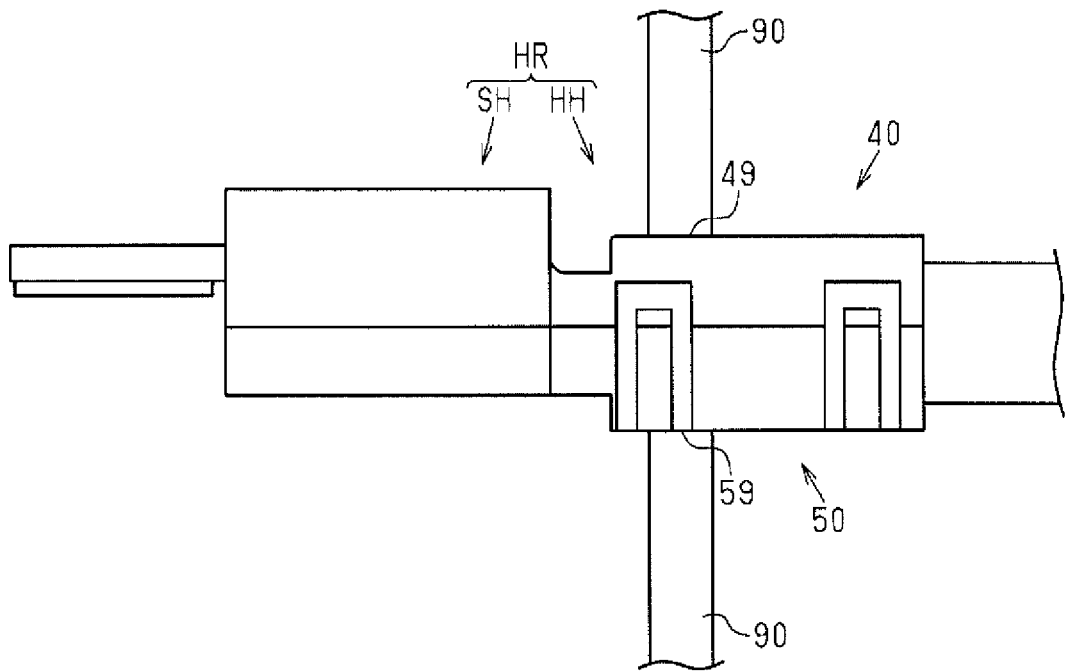
FIG. 12 is a side view illustrating how the holder is supported during injection molding of a case according to the third embodiment.

The following description discusses how the third embodiment works. The case 20 is formed by injection molding in the manner similar to the molding step illustrated in FIGS. 6B and 6C. As illustrated in FIG. 12, the molding step in the third embodiment, however, involves using removable pins 90 so as to apply pressure to an abutment surface 49 of the first holder member 40 and an abutment surface 59 of the second holder member 50. The abutment surface 49 is a surface of the portion of the first holder member 40 defining the upper portion of the harness container HH. One of the removable pins 90 is brought into contact with the abutment surface 49. The abutment surface 59 is a surface of the portion of the second holder member 50 defining the lower portion of the harness container HH. The other removable pin 90 is brought into contact with the abutment surface 59. Specifically, the use of the removable pins 90 applies pressure to the first holder member 40 and the second holder member 50 in the direction in which the first holder member 40 and the second holder member 50 face each other. The mold 70 is provided with holes into which the removable pins 90 are to be inserted. The removable pins 90 are inserted into these holes, so that injection molding is carried out, with the holder HR held at the abutment surfaces 49 and 50 by the removable pins 90.

In this embodiment, applying pressure to the abutment surfaces 49 and 50 using the removable pins 90 exerts a force that deforms the harness 30 in the direction perpendicular to the width direction W. The yarn 34 filled into the inner space of the harness 30 facilitates radial deformation of the harness 30. Thus, the force deforms the harness 30 such that the harness 30 is reduced in diameter in the direction perpendicular to the width direction W. Suppose that no force is exerted by the removable pins 90. In such a case, the first holder member 40 and the second holder member 50 may not overlap with each other in the direction perpendicular to the width direction W owing to tolerances of the harness 30. Exerting the force that deforms the harness 30, however, enables the first holder member 40 and the second holder member 50 to overlap with each other in the direction perpendicular to the width direction W. This, as illustrated in FIG. 11, allows extremities 44c of the first holder side walls 44 to come into contact with the second holder member 50. Consequently, injection molding in this embodiment causes the first holder side walls 44 to incline inward and come into contact with the second holder member 50, thus sufficiently preventing intrusion of the resin material 80 into the inner space of the harness container HH.

Figure 13:
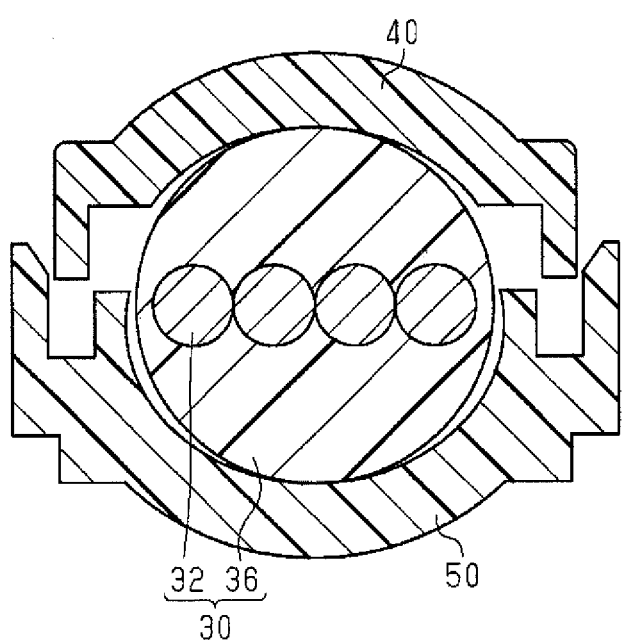
FIG. 13 is a cross-sectional view of a holder according to a comparative example of the third embodiment.

FIG. 13 illustrates a holder according to a comparative example. The wires 32 of the harness 30 in this example are directly covered with the cover 36, so that the cover 36 according to this example is thicker than the cover 36 according to the third embodiment. Thus, exerting a force using the removable pins 90 hardly deforms the harness 30. This may increase gap(s) between the first holder member 40 and the second holder member 50, resulting in intrusion of the resin material 80 into the harness container HH during the molding step.

At least one of the features of the foregoing embodiments may be changed as described below. Note that the first structure corresponds to the structure illustrated in FIG. 7B, the right side structure illustrated in FIG. 7C, and the left side structure illustrated in FIG. 7D. The second structure corresponds to the structure illustrated in FIG. 7A, the left side structure illustrated in FIG. 7C, and the right side structure illustrated in FIG. 7D. The phenomenon illustrated in FIG. 8A will be referred to as a "first phenomenon". The phenomenon illustrated in FIG. 8B will be referred to as a "second phenomenon".

Each first holder side wall 44 is not limited to a side wall having a constant thickness in the width direction W prior to injection molding of the case 20. In one example, each first holder side wall 44 may be tapered such that its thickness in the width direction W prior to injection molding of the case 20 decreases as the first holder side wall 44 extends toward the second holder member 50. In such an example, application of pressure by the resin material 80 further facilitates inward inclination of the first holder side walls 44.

The manufacture of the sensor assembly SA does not necessarily have to involve injection molding. When no injection molding is to be carried out, the manufacture of the sensor assembly SA involves simply providing the first holder side walls 44 each inclined inward in advance, instead of providing the first holder side walls 44 each extending perpendicularly with respect to the first holder principal surface 42a before insert molding of the case 20. In this case, the first holder side walls 44 and the second holder member 50 more reliably prevent intrusion of the resin to the substrate 62.

The first holder member 40 and the case 20 according to any one of the foregoing embodiments are made of the same material. Alternatively, the first holder member 40 and the case 20 may be made of different materials. In one example, the first holder member 40 may be made of a material having a melting point higher than the melting point of the material of the case 20.

Each second holder side wall 56 is not limited to a side wall having a constant thickness in the width direction W prior to injection molding of the case 20. In one example, each second holder side wall 56 may be tapered such that its thickness in the width direction W prior to injection molding of the case 20 decreases as the second holder side wall 56 extends toward the first holder member 40. In such an example, application of pressure by the resin material 80 further facilitates inward inclination of the second holder side walls 56.

The manufacture of the sensor assembly SA does not necessarily have to involve injection molding. When no injection molding is to be carried out, the manufacture of the sensor assembly SA involves simply providing the second holder side walls 56 each inclined inward in advance, instead of providing the second holder side walls 56 each extending perpendicularly with respect to the second holder principal surface 54a before insert molding of the case 20. In this case, the second holder side walls 56 and the recesses 46 according to the second embodiment more reliably prevent intrusion of the resin to the substrate 62.

The second holder member 50 and the case 20 according to any one of the foregoing embodiments are made of the same material. Alternatively, the second holder member 50 and the case 20 may be made of different materials. In one example, the second holder member 50 may be made of a material having a melting point higher than the melting point of the material of the case 20.

In the second embodiment, the labyrinth structure is provided by the first holder side walls 44 and the second holder side walls 56 so that the pair of second holder side walls 56 are located inward of the pair of first holder side walls 44 in the width direction W of the substrate 62. The invention, however, is not limited to this structure. In one example, the pair of second holder side walls 56 may be located outward of the pair of first holder side walls 44 in the width direction W. In another example, a first one of the pair of second holder side walls 56 may be located inward of a first one of the pair of first holder side walls 44 in the width direction W, and a second one of the pair of second holder side walls 56 may be located outward of a second one of the pair of first holder side walls 44 in the width direction W.

In the third embodiment, the portion of the second holder member 50 defining the lower portion of the harness container HH is provided with two pairs of the second holder side walls 56 extending partially along the lateral surfaces of the harness container HH in the direction of protrusion of the substrate 62 from the holder HR. The invention, however, is not limited to this arrangement. Alternatively, the portion of the second holder member 50 defining the lower portion of the harness container HH may be provided with the second holder side walls 56 extending across the lateral surfaces of the harness container HH in the direction of protrusion of the substrate 62 from the holder HR. In this alternative embodiment, the pair of second holder side walls 56 do not necessarily have to be located outward of the pair of first holder side walls 44 in the width direction W of the substrate 62. In this alternative embodiment, the pair of second holder side walls 56 may be located inward of the pair of first holder side walls 44 in the width direction W. In the third embodiment, the portion of the second holder member 50 defining the lower portion of the harness container HH does not necessarily have to be provided with the second holder side walls 56.

In one example, the structure illustrated in FIG. 7A may be such that the first holder side walls 44 are inclined inward and in contact with the second holder side walls 56. The inner space of the cover 36 of the harness 30 according to the third embodiment is filled with the yarn 34. Alternatively, the inner space of the cover 36 may be filled with any other material. The inner space of the cover 36 may be filled with a gel or resin, for example. In other words, the inner space of the cover 36 may be filled with any material that is more deformable than the cover 36.

The number of Hall element-equipped integrated circuits 64 included in the magnetic sensor circuit 60 is not limited to two. Alternatively, the number of integrated circuits 64 included in the magnetic sensor circuit 60 may be one or three or more.

The magnetic sensor circuit 60 does not necessarily have to include the substrate 62. Alternatively, the magnetic sensor circuit 60 may include Hall element-equipped integrated circuit(s) 64, and a conductor to which pin(s) of the integrated circuits) 64 is/are welded, with the conductor connected to the harness 30. In such an alternative embodiment, the principal surface of the conductor portion of the magnetic sensor circuit 60 may be used as a circuit principal surface, and the conductor portion may be at least partially contained in the holder HR.

A magnetic sensing element to be provided on each integrated circuit 64 is not limited to a Hall element, but may be a tunnel magnetoresistive (TMR) element, for example.

The number of teeth 13a, the number of teeth 13b, the number of north poles of the permanent magnet 18, and the number of south poles of the permanent magnet 18 included in the magnetic flux output device 10 are not limited to those illustrated in FIG. 1.

What is claimed is:

1. A sensor assembly for a torque sensor including a magnetic flux output device to output a magnetic flux in response to torsion produced between ends of a torsion bar, the sensor assembly comprising:
    a magnetic sensor circuit configured to output a detection value indicating a torque applied to the torsion bar, the detection value being calculated from the magnetic flux output from the magnetic flux output device, the magnetic sensor circuit including first and second circuit principal surfaces;
    a holder holding the magnetic sensor circuit; and
    a case comprising a separate element from the holder and surrounding the holder, thereby disposing the holder inside the case, wherein
    the holder includes
        a first holder member including a first holder principal surface facing the first circuit principal surface of the magnetic sensor circuit, and
        a second holder member including a second holder principal surface facing the second circuit principal surface of the magnetic sensor circuit,
    the first holder member further includes a first holder side wall protruding from the first holder principal surface toward the second holder member,
    the magnetic sensor circuit is partially disposed in a space defined by the first holder member, the second holder member, and the first holder side wall and is thus held by the holder,
    the first holder side wall is inclined inward and in contact with the second holder member, and
    the case is made of a resin, an inside surface of the case being in contact with a first holder side wall outer surface of the first holder side wall.

2. The sensor assembly according to claim 1, wherein
    the first holder side wall includes a pair of first holder side walls extending from opposite sides of the first holder principal surface,
    the second holder member further includes a second holder side wall protruding from the second holder principal surface toward the first holder member,
    the second holder side wall includes a pair of second holder side walls extending from opposite sides of the second holder principal surface,
    a first one of the pair of first holder side walls is disposed adjacently outward or inward of a first one of the pair of second holder side walls,
    a second one of the pair of first holder side walls is disposed adjacently outward or inward of a second one of the pair of second holder side walls, and
    the sensor assembly has at least one or both of
        a first structure in which at least one of the first holder side walls is inclined inward and in contact with the second holder member, and the first holder side wall outer surface of the at least one of the first holder side walls is in contact with the resin constituting the case, and
        a second structure in which at least one of the second holder side walls is inclined inward and in contact with the first holder member, and a second holder side wall outer surface of the at least one of the second holder side walls is in contact with the resin constituting the case.

3. The sensor assembly according to claim 1, further comprising a harness including a plurality of wires bound together, the plurality of wires being connected to the magnetic sensor circuit, wherein
    the holder includes a harness container,
    the first holder member includes a portion defining a first portion of the harness container, and the second holder member includes a portion defining a second portion of the harness container, the portions of the first and second holder members containing an end of the harness, and
    the harness further includes
        a cover covering the plurality of wires and defining an outer periphery of the harness, and
        a material filled together with the plurality of wires into an inner space of the cover, the material being more deformable than the cover.

4. A method for manufacturing a sensor assembly for a torque sensor including a magnetic flux output device to output a magnetic flux in response to torsion produced between ends of a torsion bar, the sensor assembly including:
    a magnetic sensor circuit configured to output a detection value indicating a torque applied to the torsion bar, the detection value being calculated from the magnetic flux output from the magnetic flux output device, the magnetic sensor circuit including first and second circuit principal surfaces;
    a holder holding the magnetic sensor circuit; and
    a case comprising a separate element from the holder and surrounding the holder, thereby disposing the holder inside the case,
    the holder including
        a first holder member including a first holder principal surface facing the first circuit principal surface of the magnetic sensor circuit, and a second holder member including a second holder principal surface facing the second circuit principal surface of the magnetic sensor circuit, the first holder member further including a first holder side wall protruding from the first holder principal surface toward the second holder member, the magnetic sensor circuit being partially disposed in a space defined by the first holder member, the second holder member, and the first holder side wall and being thus held by the holder, an inside surface of the case being in contact with a first holder side wall outer surface of the first holder side wall, the sensor assembly manufacturing method comprising:

a) placing a portion of the magnetic sensor circuit in the holder; and b) placing, in a mold for forming the case, the holder containing the portion of the magnetic sensor circuit, and injecting a fluid resin material into the mold so as to injection-mold the case, wherein step b) involves application of pressure from the resin material to the first holder side wall, the pressure pressing the first holder side wall inward and thus causing the first holder side wall to incline inward and come into contact with the second holder member and an inside surface of the case to contact a first holder side wall outer surface of the first holder side wall.

5. The sensor assembly manufacturing method according to claim 4, wherein the first holder side wall includes a pair of first holder side walls extending from opposite sides of the first holder principal surface, the second holder member further includes a second holder side wall protruding from the second holder principal surface toward the first holder member, the second holder side wall includes a pair of second holder side walls extending from opposite sides of the second holder principal surface, step a) involves disposing a first one of the pair of first holder side walls adjacently outward or inward of a first one of the pair of second holder side walls, step a) further involves disposing a second one of the pair of first holder side walls adjacently outward or inward of a second one of the pair of second holder side walls, and step b) further involves inducing at least one or both of a first phenomenon in which the resin material applies pressure to at least one of the first holder side walls so as to press the at least one of the first holder side walls inward, thus causing the at least one of the first holder side walls to incline inward and come into contact with the second holder member, and a second phenomenon in which the resin material applies pressure to at least one of the second holder side walls so as to press the at least one of the second holder side walls inward, thus causing the at least one of the second holder side walls to incline inward and come into contact with the first holder member.

6. The sensor assembly manufacturing method according to claim 4, wherein the magnetic sensor circuit includes a substrate, and an integrated circuit including a magnetic sensing element, the integrated circuit being soldered to the substrate, and each of the first and second circuit principal surfaces is a principal surface of the substrate.

7. The sensor assembly manufacturing method according to claim 4, wherein the sensor assembly further includes a harness including a plurality of wires bound together, the plurality of wires being connected to the magnetic sensor circuit, the holder includes a harness container, the first holder member includes a portion defining a first portion of the harness container, and the second holder member includes a portion defining a second portion of the harness container, the portions of the first and second holder members containing an end of the harness, the harness further includes a cover covering the plurality of wires and defining an outer periphery of the harness, and a material filled together with the plurality of wires into an inner space of the cover, the material being more deformable than the cover, step a) involves placing a portion of the harness in the holder, and step b) involves placing, in the mold, the holder containing the portion of the magnetic sensor circuit and the portion of the harness, and injecting the fluid resin material into the mold, thus causing application of pressure to the portion of the first holder member defining the first portion of the harness container and to the portion of the second holder member defining the second portion of the harness container, the pressure being applied in a direction in which the first holder member and the second holder member face each other.

* * * * *